(12) United States Patent
Arthur et al.

(10) Patent No.: US 6,841,799 B2
(45) Date of Patent: Jan. 11, 2005

(54) OPTOELECTRONIC PACKAGE

(75) Inventors: Simon Arthur, Ipswich (GB); Sonia Ashmore, Ipswich (GB); Helen Lewis, Ipswich (GB)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/624,057

(22) Filed: Jul. 21, 2003

(65) Prior Publication Data

US 2004/0089865 A1 May 13, 2004

(30) Foreign Application Priority Data

Aug. 9, 2002 (EP) .............................. 02255584

(51) Int. Cl.[7] .............................................. H01L 27/15
(52) U.S. Cl. ........................... 257/81; 257/99; 257/433; 257/680; 257/703
(58) Field of Search .............................. 257/81, 98, 99, 257/432, 433, 434, 680, 690, 703

(56) References Cited

U.S. PATENT DOCUMENTS 5,828,074 A * 10/1998 Pearlman ..................... 250/551
6,188,118 B1   2/2001 Severn ......................... 257/432

FOREIGN PATENT DOCUMENTS

| DE | 100 41 328 | 3/2002 |
|---|---|---|
| GB | 2 126 795 | 3/1984 |
| JP | 07147349 | 6/1995 |
| JP | 07294777 | 11/1995 |
| JP | 08005872 | 1/1996 |
| JP | 2001085706 | 3/2001 |
| JP | 20011291903 | 10/2001 |

OTHER PUBLICATIONS

Gnugesser, H., European Search Report Application No. EP 02 25 5584 dated Nov. 19, 2002.

* cited by examiner

Primary Examiner—Mark V. Prenty

(57) ABSTRACT

An optical device having a housing for one or more optoelectronic components, for example a semiconductor laser transmitter or a photodiode. The optoelectronic device, comprises an open-ended metal canister, an insulating substrate, at least one optoelectronic component mounted on the substrate, and one or more electrical connections made to the component(s). The insulating substrate closes the open end of the metal canister so that the metal canister and insulating substrate together form a housing for one or more of the components mounted on the substrate. The insulating substrate acts as a circuit board to carry the electrical connections from the component(s) externally of the housing. The canister has at least one optical port by which optical radiation may be transmitted into and/or out of the housing.

10 Claims, 3 Drawing Sheets

OPTOELECTRONIC PACKAGE

FIELD OF THE INVENTION

The present invention relates to an optoelectronic package including a housing for one or more optoelectronic components, for example a semiconductor laser transmitter or a photodiode.

DISCUSSION OF THE BACKGROUND ART

Optoelectronic components often include a housing, either to protect the components from dust or dirt that might interfere with optical transmission to or from the components or to allow ease of interconnection to or from the optoelectronic components. Environmental protection from oxygen or water vapour is sometimes also needed in order to achieve a useful operating lifetime. Some optical transmitter devices are held within a housing in order to improve eye safety or so that other devices such as an optical fibre connector can readily be connected to the transmitter device.

One common type of housing is the TO-header style coaxial package. This consists of a cylindrical metal housing with an axial window on an upper surface of the housing, and a number of electrical connection pins extending away in an axial direction from the opposite lower surface of the housing.

The metal housing provides excellent protection for any optoelectronic components within the housing, but creates problems in making electrical connections to such components. A conventional way of making such connections is to provide glass-insulated metal feedthroughs in the base to isolate the connections from the housing. This creates a lack of design flexibility as all components must be at the same potential as the housing base, or else isolated from the housing base. If wire bonds are used, the connections may need to be relatively long to reach from a feedthrough pin to the required component. Such long connections can limit high frequency performance, for example performance in excess of about 2 GHz. It is also the case that conventional feedthroughs generally include metal pins formed from an alloy such as that sold under the trade mark Kovar™. Kovar™ is a trade mark of CSR Holdings, Inc., a subsidiary of Carpenter Technology Corporation. Kovar™ is a metal alloy whose thermal expansion matches that of glass/ceramic.

Unfortunately, such pins are not ideal for high speed interconnects due to their induction. Careful attention must be paid to the interconnection with external components or circuit boards in terms of the pin length, form and shape. These feedthroughs can be difficult to optimize for fixed impedance transmission lines.

The space available within the housing for components can also be limited owing to the large area taken up by the glass seals. The maximum number of feedthroughs is similarly limited.

It is also necessary with glass-insulated metal feedthroughs to avoid introducing mechanical stresses in the feedthrough that can induce cracking. Therefore, when an external connection pin is to be curved, for example at right angles, the curved section of the connection pin must be separated from the feedthrough by about 3 to 4 mm. This increases the total size of the optoelectronic package.

One way to deal with these problems is to mount components on a printed circuit board (pcb), and then mount the pcb inside the metal housing. This allows for easier electrical routing within the housing, but increases the component count and assembly procedures. There also remain issues associated with alignment and connection of this subassembly to the feedthroughs in the housing base. This approach does not address the problem of the limited maximum number of feedthroughs.

SUMMARY OF THE INVENTION

According to the invention, there is provided an optoelectronic device, comprising an open-ended metal canister, an insulating substrate, at least one optoelectronic component mounted on said substrate, and one or more electrical connections made to said component(s), wherein:

the insulating substrate closes the open end of the metal canister so that the metal canister and insulating substrate together form a housing for one or more of said components mounted on the substrate;

the insulating substrate acts as a circuit board to carry said electrical connections from said component(s) externally of the housing; and the canister has at least one optical port by which optical radiation may be transmitted into and/or out of said housing.

The electrical connections may be carried by the substrate in a variety of ways. For example, one or more of the connections may include a via that extends through the substrate to an external side of the substrate. Such a via does not require the glass insulation needed with an all-metal conventional substrate. As a result, such vias can be packed more closely together, either allowing the device to be miniaturised or allowing a greater number of external connections to be made.

Another way of making an electrical connection is to use a track on or within the substrate that extends towards an edge of the substrate. A combination of vias and tracks may be used to make the external connections, or to make interconnections with one or more components inside the housing, particularly if the substrate is a multi-layer substrate. Thus the invention facilitates the making electrical connections internally and/or externally of the housing.

The invention may also be used with different types of optical port, for example one or more optical windows or lenses, or receptacles for a connector of another component, such as an optical fibre.

The canister may be bonded to the substrate, for example by glue, solder, brazing or by welding. The substrate may therefore include a printed metallic layer to which the open end of the canister is bonded, for example by projection or resistance welding. This is particularly useful in forming a hermetically sealed housing.

BRIEF DESCRIPTION OF THE DRAWINGS

The invention will now be further described, by way of example, with reference to the accompanying drawings, in which.

DETAILED DESCRIPTION OF THE PREFERRED EMBODIMENT

Figure 1:
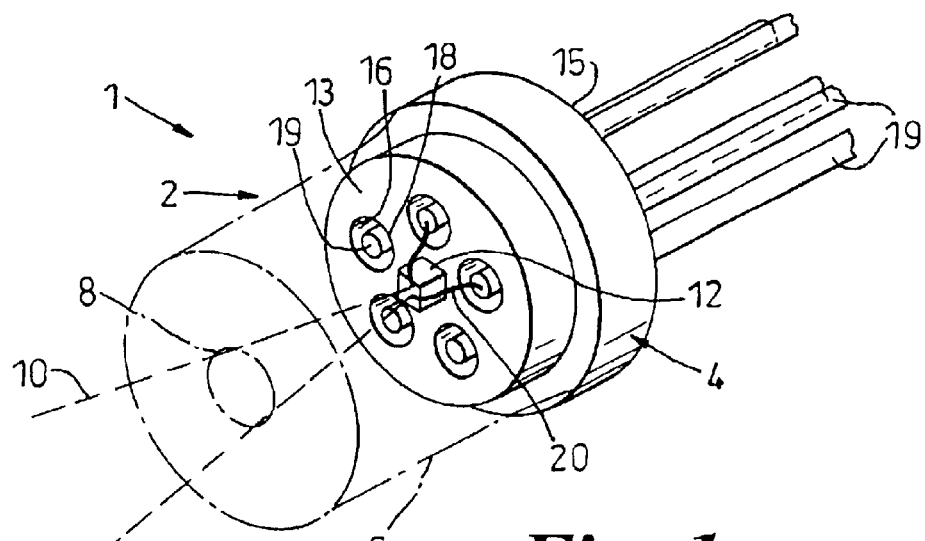
FIG. 1 is a is a perspective view of an optoelectronic device comprising a prior art all-metal housing in the form of a TO-header style coaxial package, the housing having a metal base that has been laser welded to a metal canister that has a central circular window.

FIG. 1 shows a prior art optoelectronic device 1 comprising an all-metal housing 2 in the form of a TO-header style coaxial package. The housing has a metal substrate or base 4 that has been projection welded to a metal canister 6, shown here in phantom outline, having an optical port in the form of a central circular window 8 by which optical radiation 10 can pass through the housing 2 on its way to or from an optoelectronic component 12, for example a laser diode, within the housing 2. The laser diode 12 is mounted directly on a conducting upper surface 13 of the metal base 4.

Electrical connections to the laser diode 12 are made by five connection pins 19 that extend away in an axial direction from a lower surface 15 of the base 4. In order to accommodate the area needed for five pins 19, the device needs to be at least about 6 mm in diameter. Because the base is made from metal, it is necessary to insulate the pins 19 from the base 4. Each connection pin 19 therefore extends within an insulating glass sleeve 16 through a hole 18 in the base 4. The holes 18 take up a significant fraction of the available area of the base upper surface 13.

Electrical wires 20 are then wire-bonded from the pins 19 within the housing 2 to the optoelectronic device 12.

Figure 2:
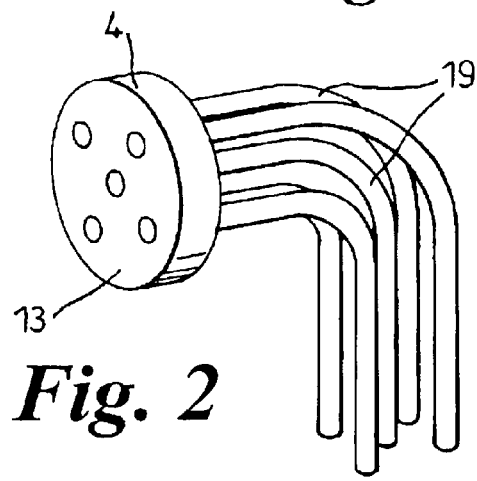
FIG. 2 is a perspective view of a prior art metal base similar to that of FIG. 4, showing how a number of pins may be bent through 90 degrees.

FIG. 2 shows how the pins 19 can be bent through right angles when for example the prior art device 1 is to be mounted on a circuit board (not shown) and receive or transmit optical radiation parallel to the plane of the board. The size of the housing and distance required for mechanical relief, typically 10 mm in diameter, imposes a minimum length on the curved pins 19, which may limit the frequency at which the prior art device 1 can operate. If a smaller housing is used, for example a 3 mm diameter housing, then it becomes very difficult to provide five pins 19. A 3 mm housing would typically be limited to about two pins.

Figure 3:
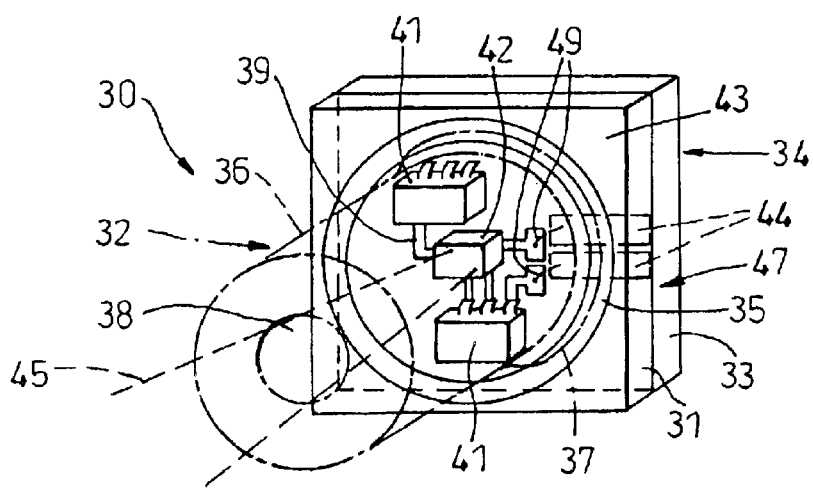
FIG. 3 is a perspective view of an optoelectronic device according to a first embodiment of the invention, comprising a housing in the form of a TO-style coaxial package with a metal canister bonded to a square multi-layer ceramic base having surface and embedded circuit tracks connected by vias.

FIG. 3 shows an optoelectronic device 30 according to a first embodiment of the invention, comprising a housing 32 in the form of a TO-style coaxial package with a generally cylindrical metal canister 36 bonded to a square multi-layer insulating ceramic base 34. The canister 36 has a circular window 38 for allowing optical radiation 45 to pass into or out of the canister on its way to or from at least one optoelectronic component 42 within the canister 36.

The base has an upper surface 43 with a number of metalised areas, including an annular metalised ring 35 to which an open circular end 37 of the canister 36 is bonded, for example by soldering, brazing or projection or laser welding.

The canister 36 is shown in phantom outline so that various internal components within the housing 32 can be seen. These components include the optoelectronic component 42 which is mounted on the upper surface 43 of the ceramic base 34. The optoelectronic component 42 is connected to other electronic components 41 by metalised tracks 39 on the ceramic upper surface 43.

The ceramic base 34 shown in FIG. 3 has two layers 31,33, between which are sandwiched electrical tracks 44 that lead to an exposed edge 47 of the device 30. Vias 49 extend between the sandwiched tracks 44 to the metalised surface tracks 39. External electrical connections to the device 30 can therefore be made from the sandwiched tracks 44 at the exposed edge 47 of the device 30.

The device 30 offers a number of advantages, particularly the ability to incorporate and position components 41,42 within the housing 32 essentially without regard to the number or position of the external electrical contacts to the sandwiched tracks 44.

Figure 4:
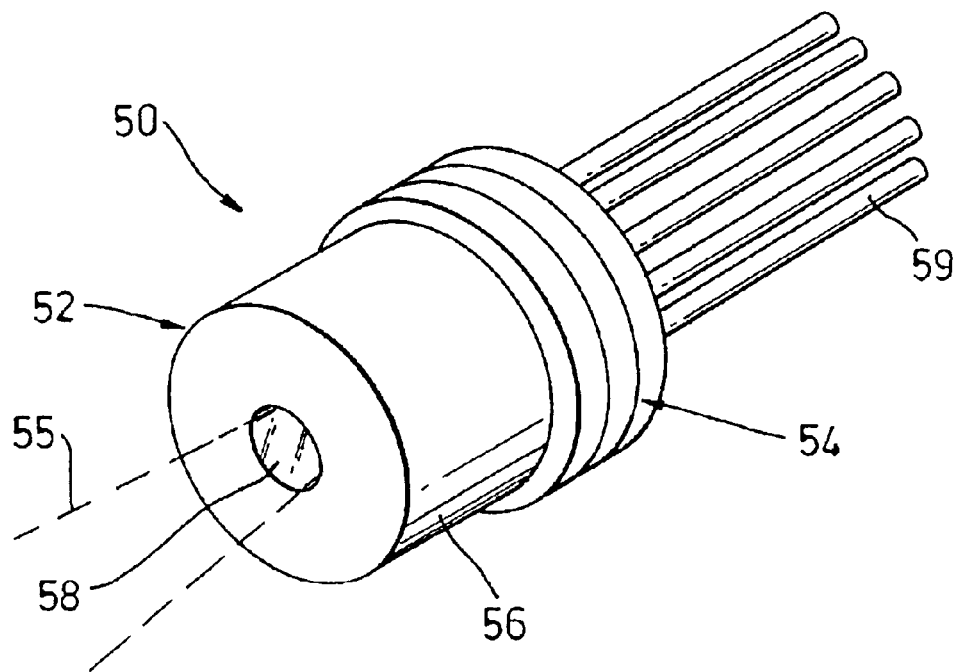
FIG. 4 is a perspective view of an optoelectronic device according to a second embodiment of the invention similar to that of FIG. 4, but having a single-layer circular ceramic base an a number of axial contact pins.

FIG. 4 shows an optoelectronic device 50 according to a second embodiment of the invention. The device 50 has a housing 52 with a cylindrical metal canister 56, and internal optoelectronic components (not shown) similar to that of FIG. 4. The device 50 has a circular optical window 58 that allows optical radiation 55 to pass into or out of the canister, as described above for the first embodiment 30. The device 50 differs from the first embodiment 30 in that the housing 52 is connected to a circular single-layer insulating ceramic base 54 through which pass a number of vias. Pins 59 are brazed to the ceramic base 54, for example to contact pads (not shown) that are electrically connected to the components. Electrical surface tracks (not shown) similar to those shown in FIG. 3 can then be made to the internal components.

The device 50 provides the advantage that the package and pin configuration can be made plug-compatible with existing TO-style optoelectronic packages.

Figure 5:
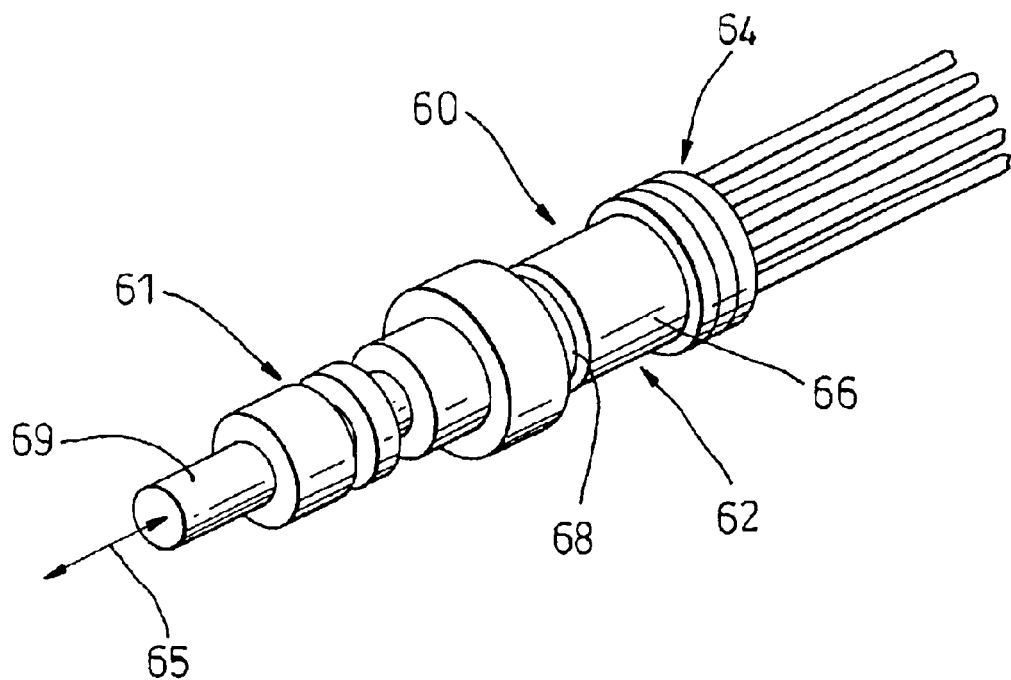
FIG. 5 is a perspective view of an optoelectronic device according to a third embodiment of the invention, comprising a housing having a metal canister bonded to a circular ceramic base, the canister having a socket into which is plugged a fibre optic connector.

FIG. 5 shows an optoelectronic device 60 according to a third embodiment of the invention. The device 60 is similar to that of the device 50 shown in FIG. 4, having a cylindrical metal canister 66 and a single layer ceramic base 64 forming a housing 62, but instead of a window 58 has an optical port in the form of a socket 68 into which is plugged a fibre optic connector 61 for a pluggable patch or alternatively modified for a fibre pigtail 69 that carries optical radiation 65 to or from the optical port 68.

Figure 6:
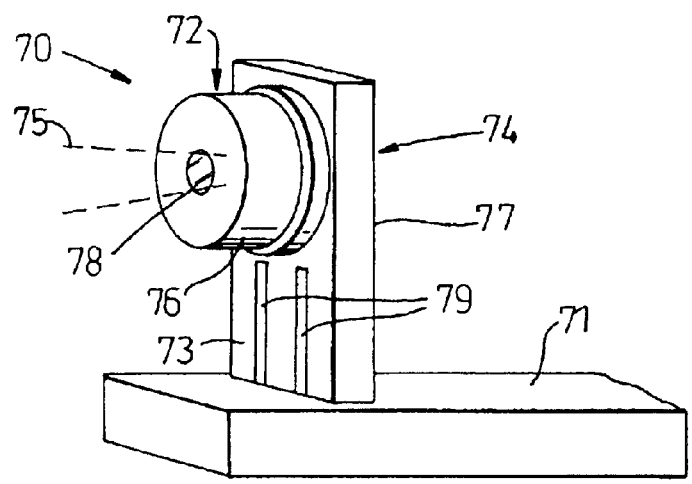
FIG. 6 is a perspective view of a fourth embodiment of the invention, comprising a housing with a ceramic substrate bonded to a metal canister having a central circular window, the ceramic substrate being mounted on a printed circuit board.

FIG. 6 shows an optoelectronic device 70 according to a fourth embodiment of the invention. The device 70 is similar to the device 30 of FIG. 3, comprising a housing 72 with an insulating ceramic substrate 74 bonded to a metal canister 76 that has a central circular window 78. Optical radiation 75 may pass through the window 78 on its way to or from the housing 72. The ceramic substrate 74 may be single-layer or multi-layer, and extends laterally away from the housing 72 to facilitate a connection with a printed circuit board (pcb) 71. Electrical tracks 79 may be provided on either side 73,77 of the ceramic base 74 to make electrical connections with the pcb 71. The tracks 79 may terminate in through pins for solder connection to matching through holes in the pcb 71. Alternatively, the tracks 79 may wrap around the end of the substrate 74 for surface mount soldering to the pcb 71. Tracks 79 on the same side 73 of the base 74 as the metallic canister 76 may pass under the canister 76 if there is an intervening insulating layer, which may be a lithographically defined printed layer (not shown).

Figure 7:
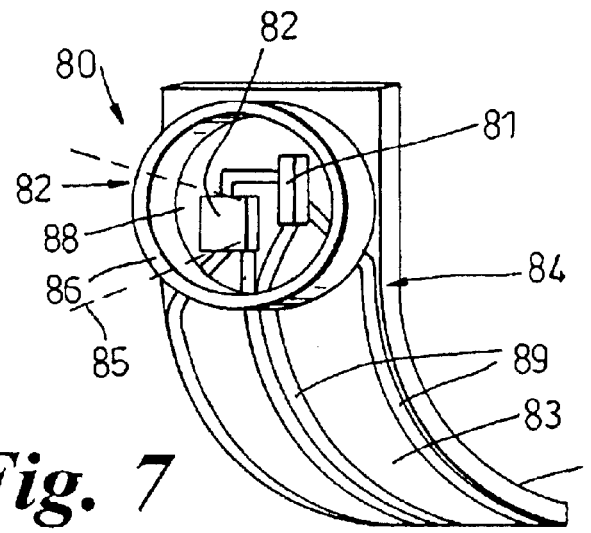
FIG. 7 is a perspective view of a fifth embodiment of the invention, comprising a housing having a flex circuit strip bonded to a metal canister that has a window.

FIG. 7 shows a fifth embodiment of the invention 80, comprising a housing 82 having a flex circuit strip 84 bonded to a cylindrical metal canister 86. The flex strip may be made from a high performance insulating polymer such as polyimide. The canister 86 has a relatively large window 88 with a diameter similar to that of the canister 86, and would be suitable for use with large area optoelectronic components 82, a example photo-detector for detecting optical radiation 85. Electrical tracks 89 for making electrical connections with components 81,82 within the housing 82 may be printed on one or both sides 83,87 of the flex circuit strip 84.

Figure 8:
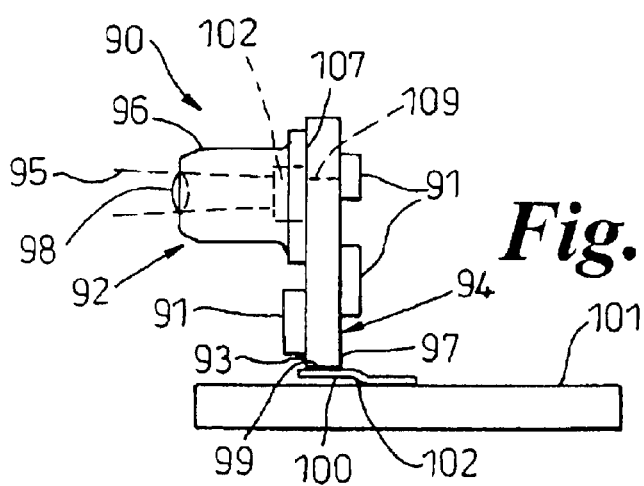
FIG. 8 is a side view of a sixth embodiment of the invention, similar to that of FIG. 6, but having electronic components mounted on both sides of the ceramic substrate.

An insulating base used with the invention is not restricted in its size or shape, and can be optimised for a particular application. Active and passive components can lie on either side of the substrate inside or outside the canister. Therefore, FIG. 8 shows a side view of a sixth embodiment 90 of the invention, similar to that of the FIG. 6, having a generally cylindrical metal canister 96 an open end 107 of which is bonded to a rectangular ceramic substrate 94. The sixth embodiment differs in that an optical port has a lens 98 and electronic components 91 are mounted on both sides 93,97 of the ceramic substrate 94. The electronic components 91 may be connected electrically to an optoelectronic component 102 within the housing 92 by tracks (not shown) and vias 109. The sixth embodiment also differs in that the tracks wrap around an end 99 of the substrate 94 so that metal leads 100 can be soldered to the tracks. The leads extend generally perpendicularly from the end 99 of the substrate 94 to allow the device 90 to be soldered to a pcb 101. The leads are sufficiently long to allow for mechanical tolerances, and may also include a flexible middle portion 102 to provide strain relief.

In any of the embodiments described above, the housing may be hermetically sealed, if required. Ceramic materials are inherently good barriers to oxygen and water vapour. The choice of substrate depends on the specific application. A ceramic substrate, such as alumina, allows for compact routing and tracking of electrical contacts. Wire and tape bonding of interconnects between components may also be used. Polymeric substrates can include suitable barrier layers. A good seal can be made between the metallic canister and the base by brazing directly to the base, or by providing a metalised upper layer on the base to which the canister may be soldered or welded.

As an alternative to alumina, insulating materials that may be used in the formation of the base include aluminium nitride, silicon carbide, diamond, quartz, sapphire and pcb materials.

Although ceramics are generally weaker than metals, they are generally stronger in compression than in tension and able to cope with the compressive forces involved in resistance welding.

The invention facilitates the incorporation of more components within the housing and offers greater functionality and better performance in a given size of package. The invention also may make use of assembly techniques already used in with standard header packages on established assembly lines.

Multi-layer bases allow for the incorporation of internal tracking, which improves space utilisation. There is also the possibility of incorporating passive components within a multi-layer structure. Both features enable package size to be minimised. The use of multiple power and ground planes, for example on an internal or a rear surface of the substrate, is possible whereas an all-metal housing can only achieve one potential.

Both sides of the base can be populated with passive and active components. For example, when the optoelectronic device includes an optical receiver, a photodiode and preamplifier integrated circuitry can be housed along with any necessary passive components, whilst a post-amplifier chip can mounted onto the reverse side of the substrate. This close packaging allows improvements in high frequency performance. The lens/window optical port can also form a hermetic environment if required. Standard all-metal housings tend to restrict the positioning of components because of the lead out and lack of space to populate both sides of the housing base.

The lens/window cap does not have to occupy the entire face of the ceramic substrate and does not need to be centrally located. For example, the optical port may be a window on a side wall of a cylindrical canister. The invention therefore offers the additional flexibility of allowing optical or opto-electronic components to be mounted outside of such a laterally directed window, for example on a lateral extension of the base. This can enable improvements in performance at high frequencies, and allows for design optimisation in certain applications. Thus, the invention is applicable to designs where the optical centre line cannot lie along the axes of the package as in a traditional coaxial arrangement, for example in a duplex connector. In this example, the substrate can be extended asymmetrically for mounting of the optical or optoelectronic components outside the area within the housing, whilst the canister remains on the optical centre line along with the necessary optoelectronic devices.

An electrically insulating base, particularly a ceramic base, can include thermal vias for the effective conduction of heat from critical areas or components, as well as electrical vias for interconnection or for providing conductive paths for assembly techniques such as projection welding.

The dielectric properties of a ceramic base combined with the process tolerances for metallisation means that well-defined transmission lines can be formed that are impedance-matched according to the requirements of the application. This allows the package to be used in high-speed applications, for example in 2+ GHz fibre optical communications. The RF path to optoelectronic components may include differential or single ended tracks. Vias and ground planes may be incorporated that are optimised for such high frequency applications.

Different methods of interconnection between the optoelectronic package described in this invention and back end electronic assemblies are possible because of increased flexibility in the positioning of electrical feedthroughs. The optoelectronic components may be connected externally by tracks and vias to brazed rectangular or cylindrical leads, flexible printed circuits, elastomeric connectors and solder-ball bumping techniques. Some of these methods offer improvements in electrical performance over the standard cylindrical lead feedthroughs at high frequencies, and also make the relative positioning of the optoelectronic package and back end electronic assemblies less sensitive to tolerancing discrepancies.

Components mounted on the base may be either active or passive. In general, for fibre optic applications there will be at least one active opto-electronic device. This will usually have to be aligned with a predetermined accuracy to the optical port. This can be achieved with various methods depending on the accuracy required. Standard pick and place machines can be used, additionally fiducials can be patterned in the metallisation on the base to help with visual alignment. Many other techniques can be used including forming mechanical features on the base to hold or align components.

Methods of attaching the base to the canister may include soldering or conductive epoxy gluing depending on the requirements of the packaging environment. The base can also be designed to be compatible with automated or manual wire bonding.

The canister need not be bonded directly to the base, but may be bonded using an intervening preform such as a metal ring that has been previously bonded to the base. The preform then forms part of the canister as bonded to the substrate.

The substrate can be any type of substrate, including rigid, flexible, or a laminated combination of flexible and rigid substrates.

The metal canister can be isolated from the base or connected to ground as required by the application. Isolation can be achieved for example with a non-metallised ceramic ring onto which the canister is attached. The non-metalised ring then forms part of the substrate.

The invention permits the use of a variety of interconnection techniques for connecting to external components or printed circuit boards. For example, the base may terminate in a connector that can be connected to a matching connector on a circuit board. A flex strip may be used to provide a flexible connection between a rigid ceramic base and another fixed component or circuit board. A single layer ceramic base may have around-edge tracking, that is, tracking over edges of the base or from one side of the base to the opposite side. This is useful for either the attachment of brazed leads or for solder bumping.

The invention therefore improves the ability to fit multiple components into a TO-header style coaxial package for use in applications such as fibre optic communications. The invention helps to increase the number and types of components that can be mounted in the package whilst keeping the overall package dimensions to a minimum.

The invention permits package designs that are compatible with existing manufacturing techniques and processes for high volume and low cost production. The invention also facilitates the use of a number of techniques to achieve high frequency operation, for example, the use of vias and printed tracks.

It is to be appreciated that certain features of the invention, which are, for clarity, described in the context of separate embodiments, may also be provided in combination in a single embodiment. Conversely, various features of the invention which are, for brevity, described in the context of a single embodiment, may also be provided separately, or in any suitable combination.

What is claimed is:

1. An optoelectronic device, comprising an open-ended metal canister, an insulating substrate, at least one optoelectronic component mounted on said substrate, and one or more electrical connections made to said component(s), wherein:

the insulating substrate closes the open end of the metal canister so that the metal canister and insulating substrate together form a housing for one or more of said components mounted on the substrate;

the insulating substrate acts as a circuit board to carry said electrical connections from said component(s) externally of the housing;

the canister has at least one optical port by which optical radiation may be transmitted into and/or out of said housing; and said electrical connection includes at least one via through said insulating substrate.

2. An optoelectronic device as claimed in claim 1, in which the housing is hermetically sealed.

3. An optoelectronic device as claimed in claim 1, wherein said optical port includes an optical window.

4. An optoelectronic device as claimed in claim 1, wherein said optical port includes a receptacle for an optical component.

5. An optoelectronic device as claimed in claim 1, in which said via extends to a side of the substrate opposite from a side of the substrate that closes the open end of the canister.

6. An optoelectronic device as claimed in claim 5, wherein said electrical connection includes a track on or within said substrate that extends towards an edge of said substrate.

7. An optoelectronic device as claimed in claim 1, wherein said substrate includes a multilayer printed circuit board for making electrical connections internally and/or externally of said housing.

8. An optoelectronic device as claimed in claim 1, wherein said substrate includes a printed metallic layer to which the open end of the canister is bonded.

9. An optoelectronic device as claimed in claim 1, wherein said substrate is a ceramic substrate.

10. An optoelectronic device as claimed in claim 1, wherein said substrate is a flex substrate.

* * * * *